United States Patent
Seo

(10) Patent No.: US 11,664,755 B2
(45) Date of Patent: May 30, 2023

(54) ARITHMETIC DEVICE AND MOTOR DRIVE DEVICE

(71) Applicant: DENSO CORPORATION, Kariya (JP)

(72) Inventor: Yuichi Seo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/564,990

(22) Filed: Dec. 29, 2021

(65) Prior Publication Data

US 2022/0239245 A1 Jul. 28, 2022

(30) Foreign Application Priority Data

Jan. 27, 2021 (JP) .............................. JP2021-011263

(51) Int. Cl.
*H02P 23/14* (2006.01)
*G01R 19/175* (2006.01)
*H02P 27/08* (2006.01)

(52) U.S. Cl.
CPC ............ *H02P 23/14* (2013.01); *G01R 19/175* (2013.01); *H02P 27/08* (2013.01)

(58) Field of Classification Search
CPC .. H02P 23/14; H02P 27/08; H02P 6/28; H02P 21/14; G01R 19/175
See application file for complete search history.

(56) References Cited

U.S. PATENT DOCUMENTS

2008/0166109 A1\* 7/2008 Park .................... H02P 6/182
388/813

FOREIGN PATENT DOCUMENTS

| JP | 5703174 B2 | 4/2015 |
| JP | 5908273 B2 | 4/2016 |
| JP | 6476001 B2 | 2/2019 |
| JP | 2019-205269 A | 11/2019 |

\* cited by examiner

*Primary Examiner* — Said Bouziane
(74) *Attorney, Agent, or Firm* — Posz Law Group, PLC

(57) ABSTRACT

An arithmetic device and a motor drive device including the arithmetic device capable of performing high accuracy motor current calculation, include a control unit performing an arithmetic processing including: acquire a duty ratio; calculate a waiting time according to the duty ratio and a waiting coefficient; detect a shunt current value at a detection timing after lapse of the waiting time; acquire, as a zero-cross current value, the shunt current value; calculate an average value using the shunt current values; and calculate an effective current value by correcting the average value using a correction coefficient.

14 Claims, 8 Drawing Sheets

ARITHMETIC DEVICE AND MOTOR DRIVE DEVICE

CROSS REFERENCE TO RELATED APPLICATION

The present application is based on and claims the benefit of priority of Japanese Patent Application No. 2021-011263, filed on Jan. 27, 2021, the disclosure of which is incorporated herein by reference.

TECHNICAL FIELD

The present disclosure generally relates to an arithmetic device and a motor drive unit.

BACKGROUND INFORMATION

A comparative motor drive device drives a three-phase motor using a sine wave. In such motor drive device, an inverter that converts electric power to be supplied to the motor is connected to a power supply device via a bus. In the motor drive device, a bus current flowing through the bus is detected at the timing when a phase current of one of the three phases becomes zero-cross (i.e., changes its value across zero, e.g., from positive to negative or from negative to positive). Then, using such bus current, the phase current values of the other two phases out of the three phases are calculated. However, assuming that the three-phase motor is driven by a square wave instead of a sine wave, there is a concern that the calculation accuracy of the phase current flowing in the motor is lowered.

SUMMARY

It is an object of the present disclosure to provide an arithmetic device and a motor drive device capable of improving a calculation accuracy of the electric current flowing in the motor.

The disclosed aspects in the specification adopt different technical solutions from each other in order to achieve their respective objectives.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
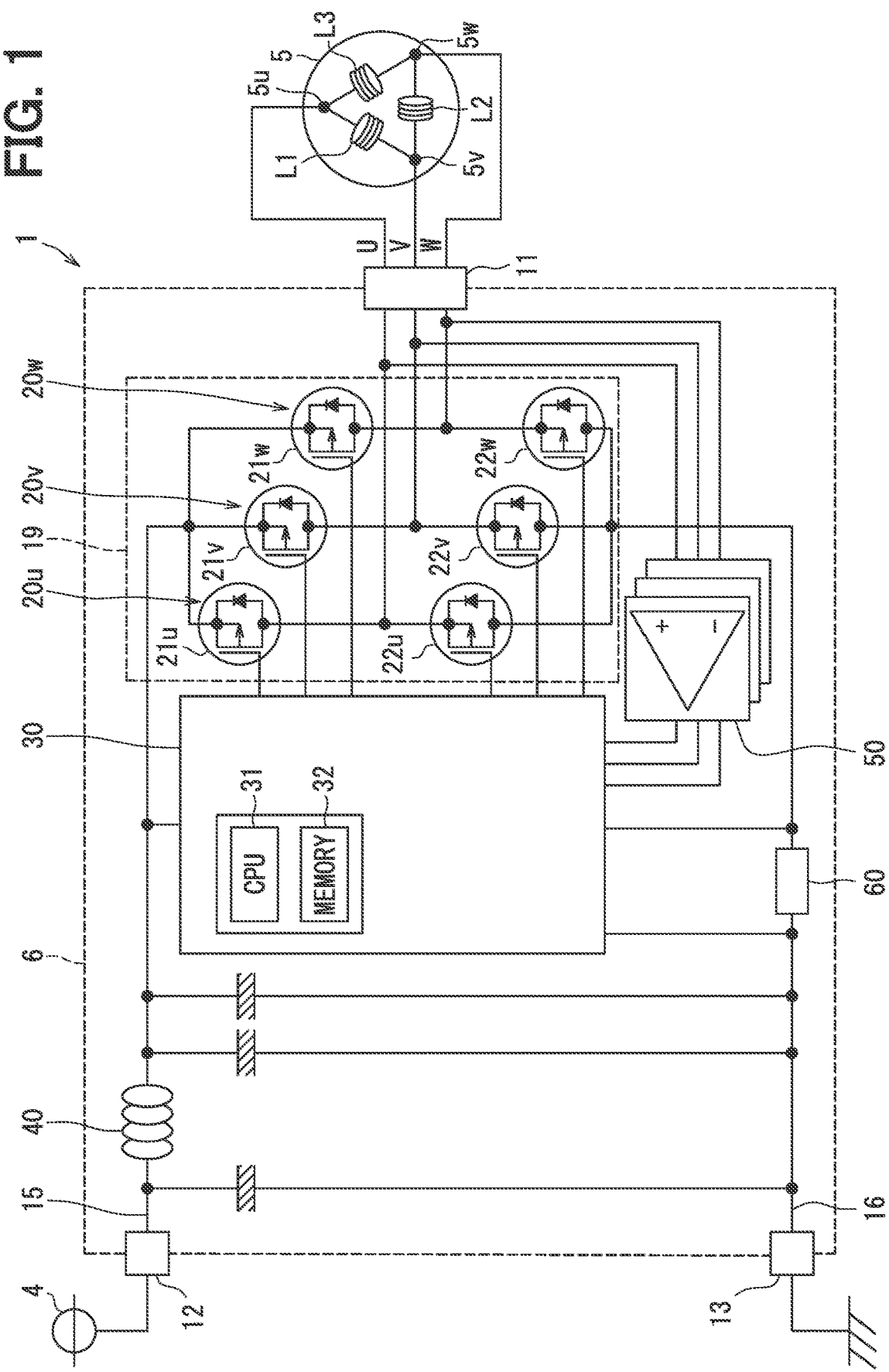
FIG. 1 is a diagram showing a configuration of a drive system according to the first embodiment.

Embodiments of the present disclosure are described with reference to the drawings. In each of the embodiments, portions corresponding to the elements/configurations described in the preceding embodiments are denoted by the same reference numerals, and redundant explanation may be omitted. When only a part of a configuration is described in an embodiment, the other part(s) of such a configuration may have the description of the corresponding part(s) in the preceding embodiment(s) readily applicable thereto. Further, a combination of the embodiments may be made, not only among the embodiments explicitly so described but also among the embodiments not explicitly described unless otherwise indicated.

First Embodiment, FIGS. 1-6

A motor system 1 shown in FIG. 1 is mounted on a vehicle such as a hybrid vehicle (HV). Such vehicle has an internal-combustion engine that consumes fuel. The motor system 1 includes a battery 4, a motor 5, and a motor drive device 6. The motor system 1 is a system for driving the motor 5 by the electric power of the battery 4. The battery 4 is a DC power source that supplies DC power to the motor drive device 6, and corresponds to a power supply unit. The battery 4 is, for example, a rechargeable secondary battery. The battery 4 has a terminal on a high potential side, which is a positive electrode, and a terminal on a low potential side, which is a negative electrode.

The motor 5 has a stator including a plurality of phase windings L1, L2, and L3, and a rotor having a plurality of magnetic pole pairs. The motor 5 is, for example, a three-phase motor having a U phase, a V phase, and a W phase. The motor 5 is a brushless motor. Further, the motor 5 is a sensor-less motor that is not provided with a position sensor.

In the motor 5, the windings L1, L2, and L3 are connected to each other by a delta connection. The winding L1 is a U-V winding connected to a U-phase terminal 5u and to a V-phase terminal 5v. The winding L2 is a V-W winding connected to the V-phase terminal 5v and a W-phase terminal 5w. The winding L3 is a W-U winding connected to the W-phase terminal 5w and the U-phase terminal 5u. The windings L1, L2, and L3 may alternatively be connected to each other by a star connection.

The motor drive device 6 converts the electric power supplied from the battery 4 to the motor 5, and drives the motor 5 with the electric power from the battery 4. The motor drive device 6 is sometimes referred to as a power conversion device. The motor drive device 6 has a motor terminal 11, a battery terminal 12, a ground terminal 13, a P line 15, and an N line 16.

The motor terminal 11 is electrically connected to each of the three windings L1, L2, and L3. The battery terminal 12 is electrically connected to the terminal on the high potential side of the battery 4. The ground terminal 13 is electrically connected to the terminal on the low potential side of the battery 4 and the ground. The P line 15 is electrically connected to the battery terminal 12 and is a power supply line on the high potential side. The N line 16 is electrically connected to the ground terminal 13 and is a power supply line on the low potential side.

The motor drive device 6 includes an inverter circuit 19, a control unit 30, a boost coil 40, a comparison circuit 50, and a shunt resistor 60. The boost coil 40 is provided on the P line 15. The boost coil 40 boosts the battery voltage supplied from the battery terminal 12 to a predetermined boost voltage, and applies the boost voltage to the inverter circuit 19.

The inverter circuit 19 converts, from direct current to alternating current, the electric power supplied from the battery 4 to the motor 5. The inverter circuit 19 is a three-phase inverter, and performs power conversion for each of the three phases. The inverter circuit 19 corresponds to a power conversion unit. The inverter circuit 19 rotates and drives the rotor of the motor 5 by sequentially switching an energized phase among the U phase, V phase, and W phase of the motor 5. The inverter circuit 19 switches the energized phase in order by sequentially switching the terminals to which the boosted voltage is applied among the terminals 5u, 5v, and 5w, which respectively serve as a voltage application terminal.

The inverter circuit 19 is a DC-AC conversion circuit. The inverter circuit 19 has upper and lower arm circuits 20u, 20v, and 20w for three phases. The upper and lower arm circuits 20u, 20v, 20w are sometimes referred to as legs. The upper and lower arm circuits 20u, 20v, and 20w have an upper arm and a lower arm, respectively. These upper arms and lower arms are connected in series between the P line 15 and the N line 16 with the upper arm on a P line 15 side. The connection point between the upper arm and the lower arm is connected to the windings L1, L2, L3 via the motor terminal 11.

In the upper and lower arm circuits 20u, 20v, 20w, the upper arm has upper arm switches 21u, 21v, 21w. The lower arm has lower arm switches 22u, 22v, 22w. These arm switches 21u, 21v, 21w, 22u, 22v, 22w are implemented as switching elements such as semiconductor elements. These switching elements are respectively a transistor having a gate, and is provided as, for example, an IGBT (Insulated-gate bipolar transistor) or MOSFET (Metal-oxide semiconductor field-effect transistor).

Regarding the U phase, the connection point between the upper arm switch 21u and the lower arm switch 22u in the upper and lower arm circuit 20u is connected to the U phase terminal 5u. Regarding the V phase, the connection point between the upper arm switch 21v and the lower arm switch 22v in the upper and lower arm circuit 20v is connected to the V phase terminal 5v. Regarding the W phase, the connection point between the upper arm switch 21w and the lower arm switch 22w in the upper and lower arm circuits 20w is connected to the W phase terminal 5w.

The upper and lower arm circuits 20u, 20v, 20w have body diodes that parasitize the arm switches 21u, 21v, 21w, 22u, 22v, 22w. In the upper arm, a body diode is provided to regulate the flow of electric current from the battery terminal 12 to the motor terminal 11. In the lower arm, a body diode is provided in a direction that regulates the flow of electric current from the motor terminal 11 to the battery terminal 12.

The control unit 30 is, for example, an ECU, which is a control device that controls the drive of the inverter circuit 19. "ECU" is an abbreviation of "Electronic Control Unit." The control unit 30 has a CPU 31 as an arithmetic processing device and a memory 32 as a storage device. The CPU 31 is a processor. The control unit 30 is mainly composed of a microcomputer including, for example, a CPU 31, a memory 32, an I/O, and a bus providing connection therebetween. The control unit 30 performs various processes related to driving of the inverter circuit 19 by performing a control program stored in the memory 32. The memory 32 is a non-transitory, tangible storage medium that stores programs and data that can be read by a computer non-transitorily. The non-transitory, tangible storage medium is realized by a semiconductor memory, a magnetic disk, or the like.

The comparison circuit 50 is electrically connected to the control unit 30. The comparison circuit 50 is a sensor circuit for detecting, as an electric angle, a phase of the electric current flowing in the motor 5. The comparison circuit 50 detects an induced voltage induced in the windings L1, L2, L3 in the motor 5. The comparison circuit 50 compares the induced voltage and a reference voltage for each of the U phase, the V phase, and the W phase, and outputs a comparison result to the control unit 30.

The reference voltage is set to a value at which the comparison circuit 50 can detect a zero-cross of the phase voltages Vu, Vv, and Vw of the motor 5. The zero-cross of the phase voltages Vu, Vv, Vw means that the phase voltages Vu, Vv, Vw become zero when the polarities of the phase voltages Vu, Vv, Vw are reversed. The reference voltage is set to, for example, zero. In the motor 5, the voltage of the U-phase terminal 5u is a U-phase voltage Vu, the voltage of the V-phase terminal 5v is a V-phase voltage Vv, and the voltage of the W-phase terminal 5w is a W-phase voltage Vw. Further, the electric current flowing through the U-phase terminal 5u is a U-phase current Iu, the electric current flowing through the V-phase terminal 5v is a V-phase current Iv, and the electric current flowing through the W-phase terminal 5w is a W-phase current Iw. The phase voltages Vu, Vv, and Vw correspond to a motor voltage, and the phase currents Iu, Iv, and Iw correspond to a motor current.

For example, the comparison circuit 50 outputs a high-level signal when the U-phase voltage Vu is greater than zero, and outputs a low-level signal when the U-phase voltage Vu is smaller than zero. The timing at which the signal output from the comparison circuit 50 is switched from one of the high level and the low level to the other is a zero-cross timing tzero at which the zero-cross of the phase voltages Vu, Vv, and Vw occurs. That is, the timing at which the polarity of the comparison result of the comparison circuit 50 is reversed is the zero-cross timing tzero.

The shunt resistor 60 is a resistance element provided on the N line 16, and is a current sensor that detects an electric current flowing through the N line 16. The shunt resistor 60 is provided at a position between the inverter circuit 19 and the ground terminal 13 on the N line 16. The voltage applied across the shunt resistor 60 is a shunt voltage Vs, and the electric current flowing through the shunt resistor 60 is a shunt current Is. The shunt current Is is an electric current flowing through the N line 16 serving as a power supply line, and corresponds to a power supply current. The shunt resistor 60 is electrically connected to the control unit 30, and information including the shunt voltage Vs is input to the control unit 30. The control unit 30 has an A/D conversion circuit, and the shunt voltage Vs input to the control unit 30 is converted from an analog signal to a digital signal by the A/D conversion circuit.

In the motor system 1, the motor 5 is driven by a square wave by the control unit 30 via the inverter circuit 19. The control unit 30 drives the motor 5 with a square wave using a PWM signal. The control unit 30 generates a drive instruction for driving the motor 5 with a square wave in response to a signal input from a higher-level ECU such as an integrated ECU mounted on the vehicle. The control unit 30 turns the arm switches 21u, 21v, 21w, 22u, 22v, and 22w into an ON state and an OFF state in response to the drive instruction.

Figure 2:
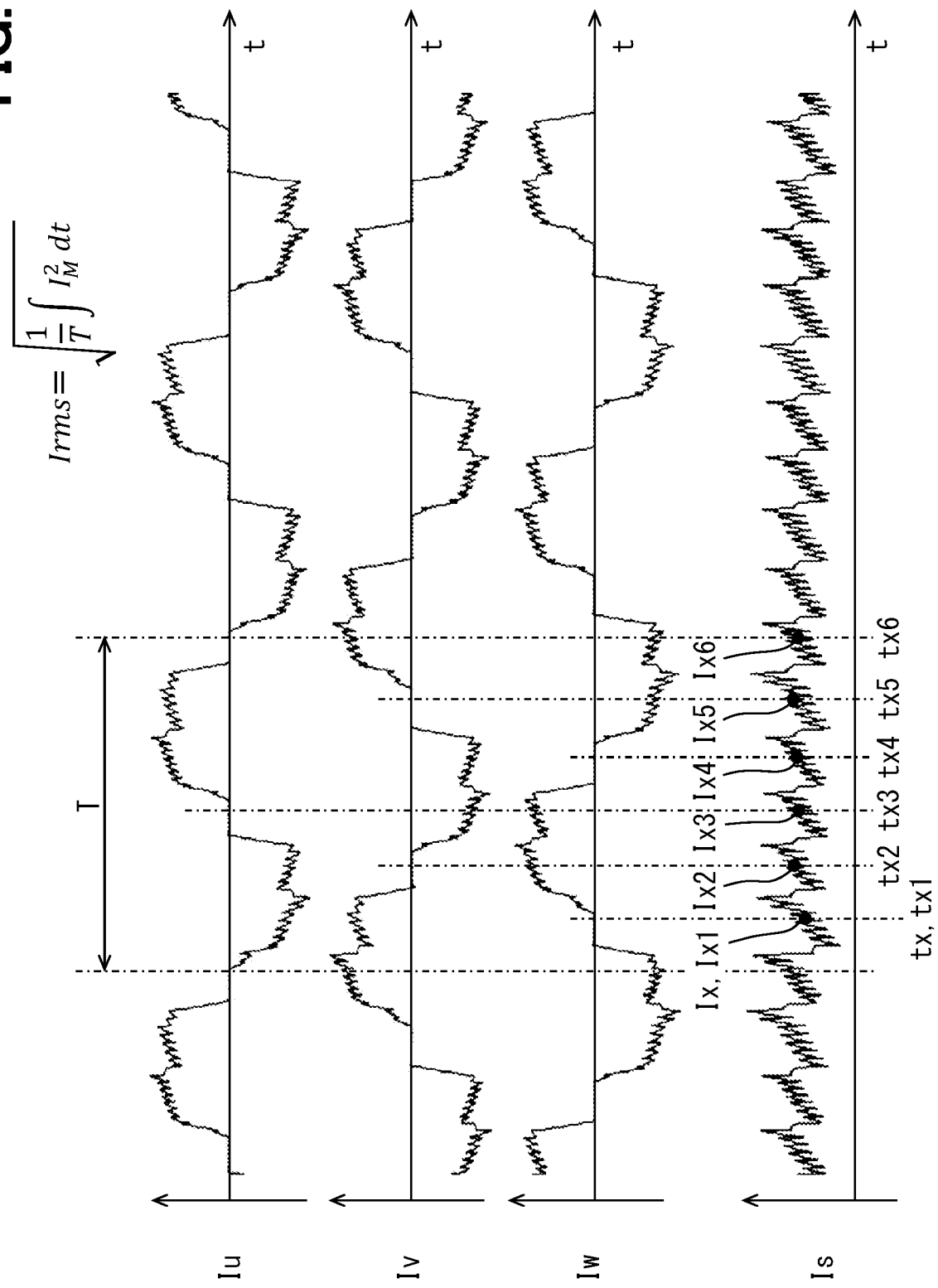
FIG. 2 is a diagram showing changes in phase current and shunt current.

The control unit 30 drives the motor 5 in a square wave. In the square wave drive, the terminals 5u, 5v, and 5w are repeatedly energized and de-energized in each of the U phase, V phase, and W phase. As shown in FIG. 2, the increase/decrease is repeatedly performed for each of the U-phase current Iu, the V-phase current Iv, and the W-phase current Iw. The control unit 30 performs square wave control in order to drive the motor 5 with a square wave. In the square wave control, a period in which the terminals 5u, 5v, 5w are energized is an energization period, and a period in which energization of the terminals 5u, 5v, 5w is stopped is an energization stop period.

The control unit 30 performs a 120-degree energization drive as the square wave drive. In the 120-degree energization drive, 120-degree energization and 60-degree energization stop are repeatedly performed for each of the U-phase, V-phase, and W-phase in terms of electric angle. In the 120-degree energization drive, an energization angle, which is the electric angle for energization, is 120 degrees. In the 120-degree energization drive, two-phase energization for energizing two of the three phases as energization phases is performed by cyclically switching the energization phases. In the 120-degree energization drive, there is a phase difference of 120 degrees in the electric angle respectively between the U-phase current Iu, the V-phase current Iv, and the W-phase current Iw. The control unit 30 drives the motor 5, i.e., performs a 120-degree energization drive of the motor 5, by performing 120-degree energization control as square wave control. In the 120-degree energization drive, the energization period is the energization angle of 120 degrees and the time corresponding to such energization angle. Further, the energization stop angle of 60 degrees and the time corresponding to the energization stop angle are the energization stop period.

As the PWM control, the control unit 30 performs a 120-degree energization drive by using a PWM signal. In the PWM control, an instruction voltage is calculated for each of the U phase, the V phase, and the W phase according to a drive instruction, and a pulsed voltage signal Vref is generated according to the instruction voltage. The voltage signal Vref is a PWM signal and corresponds to a pulse signal. The voltage signal Vref is a square wave signal. One cycle T of the voltage signal Vref is one cycle of the instruction voltage and one cycle of the electric angle. A PWM cycle Tpwm of the voltage signal Vref is one cycle of the pulse signal (see FIG. 4). The control unit 30 compares the instruction voltage with a carrier, and generates the voltage signal Vref for each of the U phase, the V phase, and the W phase. The carrier is a carrier wave such as a square wave, a triangular wave, a sawtooth wave or the like. An absolute value of the instruction voltage is a duty ratio D, and the control unit 30 generates the voltage signal Vref according to the duty ratio D. The control unit 30 drives the inverter circuit 19 according to each of the voltage signals Vref of the U phase, the V phase, and the W phase.

Figure 4:
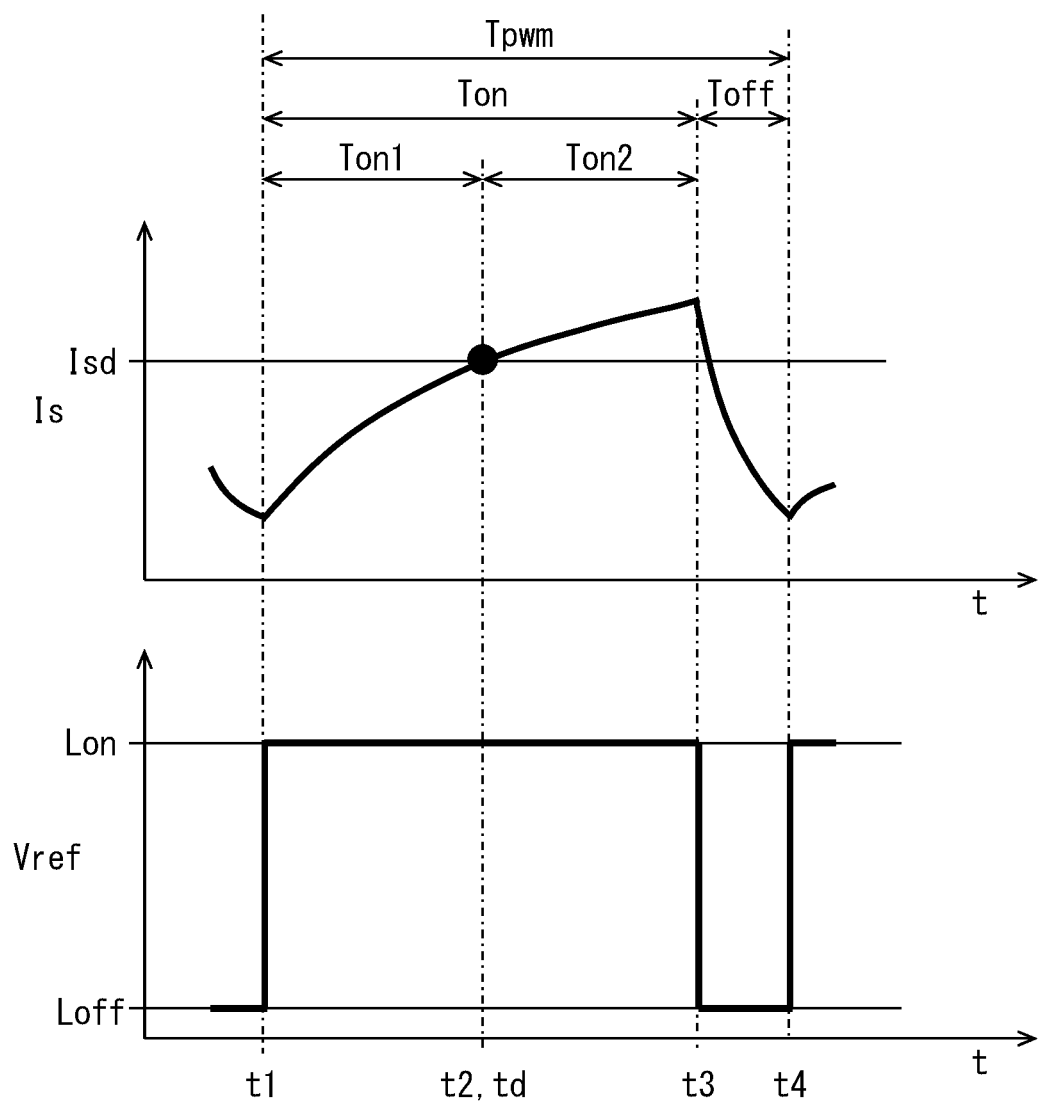
FIG. 4 is a diagram for explaining detection timing and waiting time.

The duty ratio D is on-duty. As shown in FIG. 4, one cycle of the carrier is one cycle Tpwm of the voltage signal Vref, and the duty ratio D is a ratio of the ON-time Ton to the cycle Tpwm. A value obtained by multiplying the cycle Tpwm by the duty ratio D is the ON-time Ton. The voltage signal Vref can transition between an ON-level Lon and an OFF-level Loff. The ON-level Lon is a level for turning ON the arm switches 21u, 21v, 21w, 22u, 22v, 22w, and is sometimes referred to as a high level. The OFF-level Loff is a level for turning OFF the arm switches 21u, 21v, 21w, 22u, 22v, 22w, and is sometimes referred to as a low level. The ON-time Ton is a time during which the voltage signal Vref is at the ON-level Lon and is a pulse width. In the cycle Tpwm, the time in the OFF-level Loff is an OFF-time Toff. The ON-time Ton corresponds to an ON period, and the OFF-time Toff corresponds to an OFF-period.

The control unit 30 performs arithmetic processing for calculating an effective current value Irms of the motor 5.

The effective current value Irms is an effective value of the phase currents Iu, Iv, and Iw. Ideal values of the phase currents Iu, Iv, and Iw are values in which the effective value of the U-phase current Iu, the effective value of the V-phase current Iv, and the effective value of the W-phase current Iw match.

For example, unlike the present embodiment, it is assumed that the control unit 30 uses an Equation 1 in FIG. 2 to calculate the effective current value Irms. In the Equation 1, T is a period of the phase currents Iu, Iv, Iw, and IM is phase currents Iu, Iv, Iw. In such configuration, there may be a concern that the processing load of the control unit 30 becomes excessively high due to the fact that the phase currents Iu, Iv, and Iw are used for calculating the effective current value Irms.

On the other hand, in the present embodiment, in the arithmetic processing, the control unit 30 uses the shunt current Is to calculate the effective current value Irms. The arithmetic processing is described with reference to the flowchart of FIG. 3. The control unit 30 repeatedly performs arithmetic processing at a predetermined cycle. The control unit 30 has a function of performing each step of the arithmetic processing, and corresponds to an arithmetic device.

Figure 3:
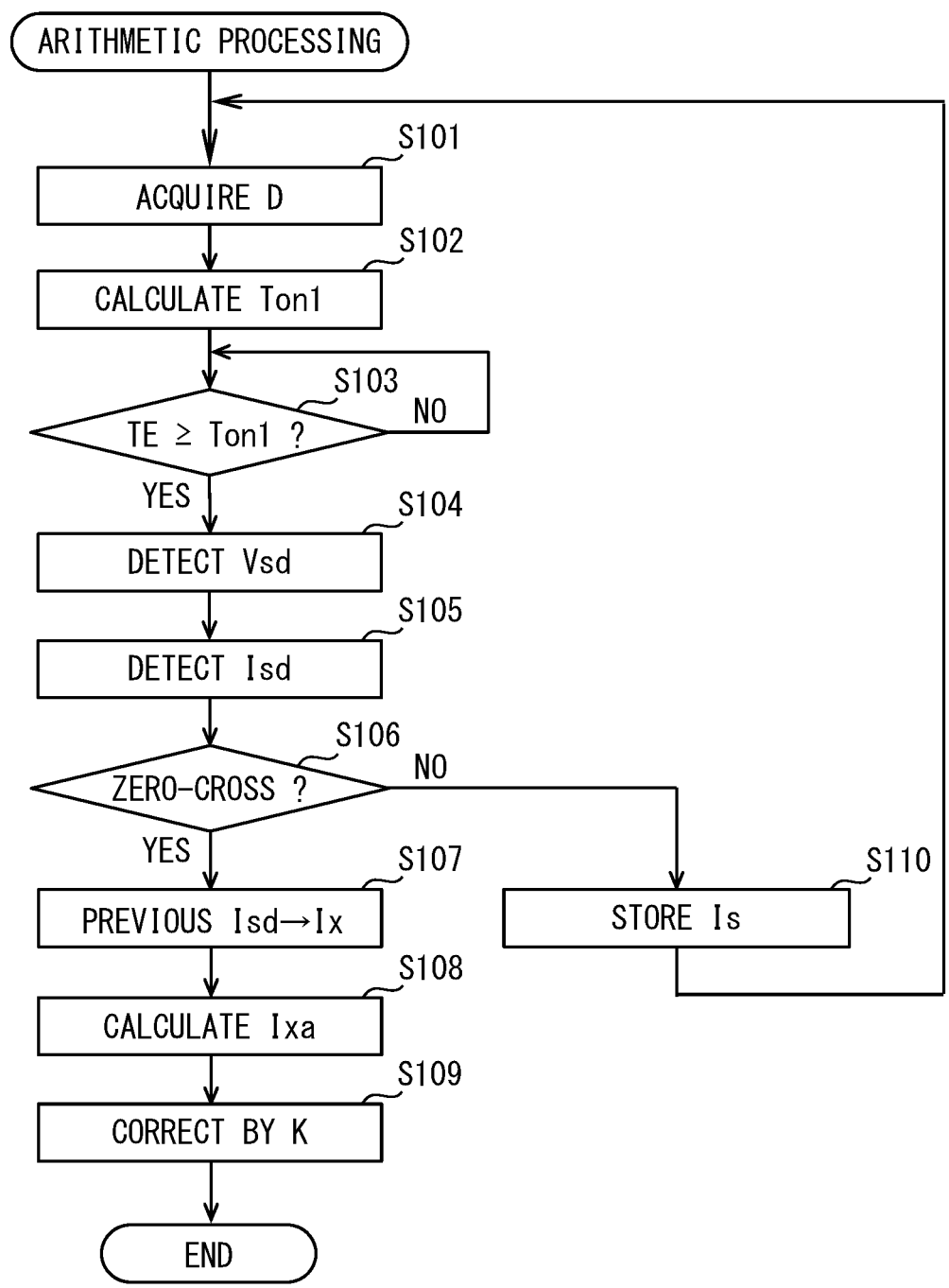
FIG. 3 is a flowchart showing a procedure of arithmetic processing.

In FIG. 3, in step S101, the duty ratio D is acquired. The duty ratio D is a value used by the control unit 30 to generate the voltage signal Vref. In step S102, a waiting time Ton1 is calculated. Here, the waiting time Ton1 is calculated by multiplying the ON-time Ton by an waiting coefficient. The waiting coefficient is a predetermined value such as, for example, 0.5. The waiting time Ton1 corresponds to a waiting period.

As shown in FIG. 4, the waiting time Ton1 is a time waiting for a detection timing td to detect the shunt voltage Vs after a start of the ON-time Ton of the voltage signal Vref. When the ON-time Ton is started at timing t1, and timing t2 is the detection timing td, time from timing t1 to timing t2 is the waiting time Ton1. When the ON-time Ton ends at timing t3, time from timing t2 to timing t3 is a remaining time Ton2. When the waiting coefficient is 0.5, the waiting time Ton1 becomes ½ of the ON-time Ton. Further, in such case, the waiting time Ton1 and the remaining time Ton2 have the same length. When one cycle Tpwm ends at timing t4, time from timing t3 to timing t4 is an OFF-time Toff.

Further, the waiting time Ton1 is time for waiting for a corresponding timing tx after a start of the ON-time Ton, which is described later. As described above, the ON-time Ton is set according to the duty ratio D. Therefore, in step S102, the waiting time Ton1 and, ultimately, the corresponding timing tx are set according to the duty ratio D. The function of the control unit 30 to perform the process of step S102 corresponds to a timing setting unit.

Returning to FIG. 3, in step S103, it is determined whether or not an elapsed time TE from the start of the ON-time Ton has reached the waiting time Ton1. If the elapsed time TE has not reached the waiting time Ton1, the determination process in step S103 is repeated until the waiting time To1 is reached, i.e., the process waits for the elapsed time TE to reach the waiting time Ton1. When the elapsed time TE reaches the waiting time Ton1, the process proceeds to step S104. In step S104, the shunt voltage Vs at the detection timing td is detected as a shunt voltage value Vsd.

In step S105, the shunt voltage value Vsd is used to detect the shunt current Is at the detection timing td as a shunt current value Isd. Here, the shunt current value Isd is calculated by dividing the shunt voltage value Vsd by the resistance value of the shunt resistor 60. The shunt current value Isd corresponds to a power supply current value. In steps S103 to S105, the shunt current value Isd is acquired each time the ON-time Ton of the voltage signal Vref arrives. The function of performing steps S103 to S105 in the control unit 30 corresponds to a power supply current unit.

As shown in FIG. 4, the shunt current Is increases or decreases in accordance with the switching of the voltage signal Vref between the ON-level Lon and the OFF-level Loff in the PWM cycle Tpwm. The shunt current Is starts to increase with the transition of the voltage signal Vref to the ON-level Lon, and starts to decrease with the transition of the voltage signal Vref to the OFF-level Loff. The shunt current Is continues to increase during the ON-time Ton of the voltage signal Vref and continues to decrease during the OFF-time Toff. The detection timing td at which the shunt voltage value Vsd and the shunt current value Isd are detected is an intermediate point of the ON-time Ton during which the shunt current Is increases. In the U phase, the V phase, and the W phase, the respective voltage signals Vref are synchronized with each other. The shunt current Is increases or decreases according to the voltage signal Vref of a phase, i.e., the U phase, the V phase, or the W phase, which is in the energization period.

Figure 5:
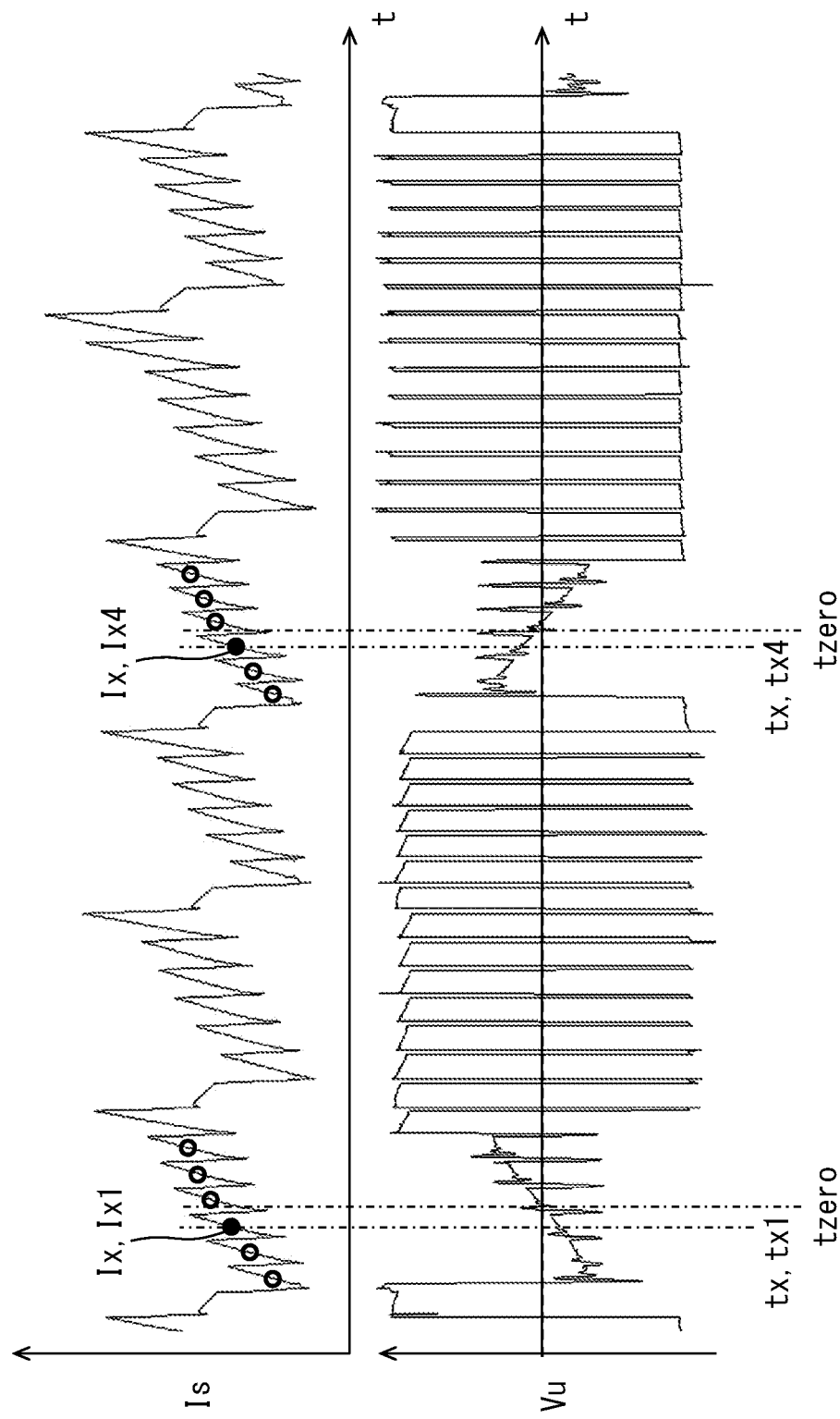
FIG. 5 is a diagram for explaining zero-cross timing and corresponding timing.

As shown in FIG. 2, the phase voltages Vu, Vv, and Vw increase or decrease due to the induced voltage generated by the motor 5 during each of the U-phase, V-phase, and W-phase energization stop periods, and the polarities thereof are reversed. That is, the zero-cross of the phase voltages Vu, Vv, and Vw occurs in each of the U-phase, V-phase, and W-phase energization stop periods. The shunt current Is increases or decreases as the phase voltages Vu, Vv, and Vw increase or decrease. The shunt current Is starts to increase at the start of the energization stop period in one of the three phases, and decreases at the end of the energization stop period. For example, as shown in FIG. 5, the shunt current Is increases in both the energization stop period in which the U-phase voltage Vu increases and the energization stop period in which the U-phase voltage Vu decreases.

Returning to FIG. 3, in step S106, it is determined whether or not a zero-cross of the phase voltage Vu, Vv, or Vw has occurred. Here, the comparison result of the comparison circuit 50 is acquired, and it is determined according to the comparison result whether or not a zero-cross occurs for each of the phase voltages Vu, Vv, and Vw. For example, for each of the U phase, the V phase, and the W phase, whether or not the polarity has reversed between a comparison result acquired in step S106 by the previous arithmetic processing and a comparison result acquired in step S106 by the current arithmetic processing is determined. If the polarities of the comparison results are not reversed, it is assumed that zero-cross of the phase voltages Vu, Vv, and Vw has not occurred, and the process proceeds to step S110. In step S110, the shunt current value Isd acquired in step S105 in the current arithmetic processing is stored in the memory 32. In the arithmetic processing, the processing of steps S101 to S106 and S110 is repeated until a zero-cross of the phase voltages Vu, Vv and Vw occurs in step S106.

The shunt current value Isd acquired in step S105 by the previous arithmetic processing is referred to as a "previous shunt current value Isd." Further, the shunt current value Isd acquired in step S105 by the current arithmetic processing is referred to as a "current shunt current value Isd." More clearly, the shunt current value Isd in step S105 is a "present shunt current value Isd". In electrical engineering, it is preferable to use "current" only for amperes, and to use "present" when describing time.

Figure 6:
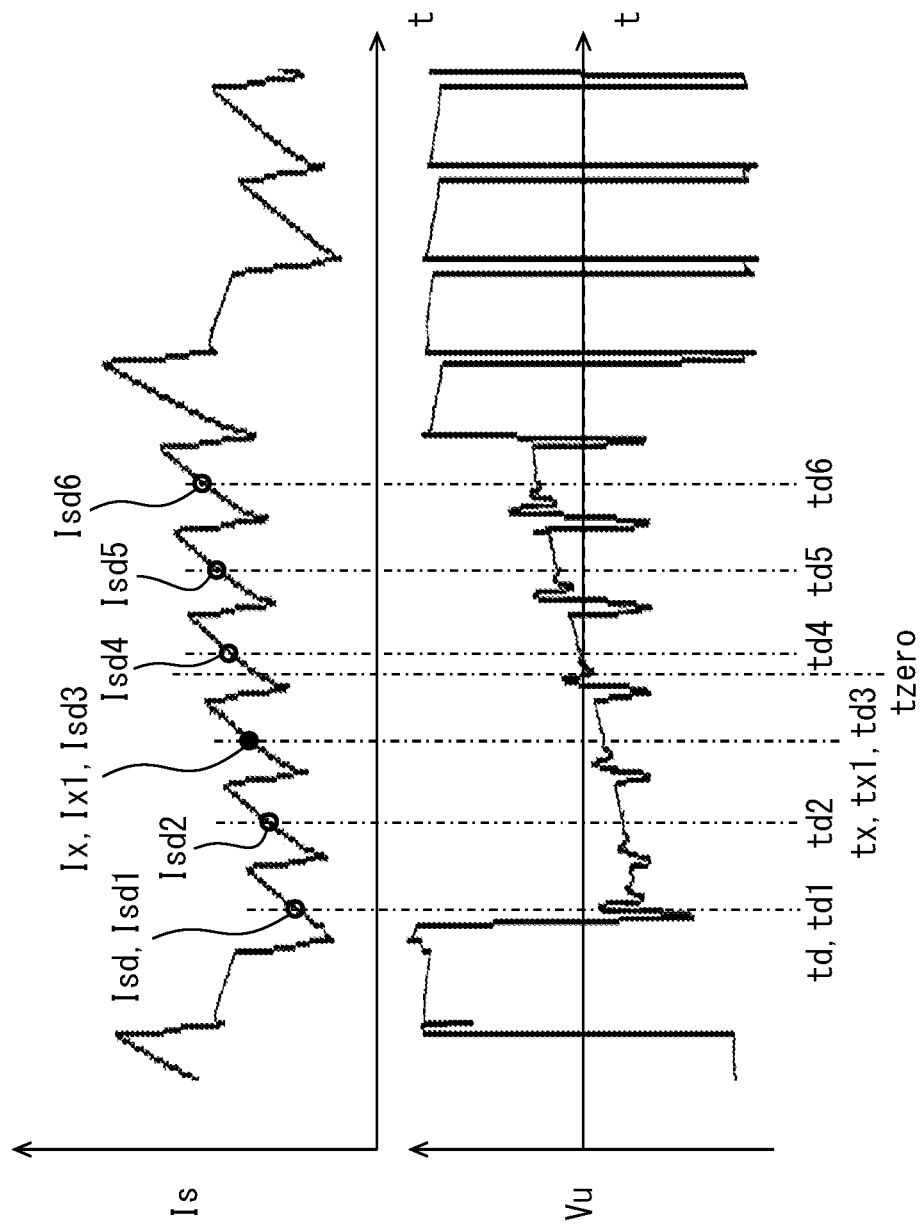
FIG. 6 is a diagram for explaining a shunt current value and a zero-cross current value.

As shown in FIG. 6, the shunt current value Isd is repeatedly detected at the detection timing td each time the voltage signal Vref is turned ON. For example, it is assumed that the shunt current values Isd1 to Isd6 are detected at detection timings td1 to td6, and the zero-cross timing tzero at which the zero-cross of the U phase voltage Vu actually occurs is between detection timings td3 and td4. In such case, since the detection timings td1 to td3 are timings before the zero-cross of the U-phase voltage Vu, the shunt current values Isd1 to Isd3 are respectively stored in the memory 32.

Returning to FIG. 3, when the polarity of the comparison result is reversed in step S106, it is assumed that zero-cross has occurred at any of the phase voltages Vu, Vv, and Vw, and the process proceeds to step S107. In step S107, the previous shunt current value Isd is read from the memory 32, and such shunt current value Isd is acquired as a zero-cross current value Ix. The detection timing td of the zero-cross current value Ix is the corresponding timing tx corresponding to the zero-cross of the phase voltages Vu, Vv, and Vw. The corresponding timing tx is the timing immediately before the zero-cross timing tzero. That is, the corresponding timing tx is a detection timing td at which the previous shunt current value Isd was detected. Note that, in such step S107, the zero-cross current value Ix is stored in the memory 32.

In steps S106 and S107, the shunt current value Isd already acquired by step S105 immediately before the zero-cross of the phase voltages Vu, Vv, and Vw is selected as a zero-cross current value Ix. Here, it is assumed that step S105 acquires the shunt current value Isd at two timings, i.e., at a before-zero-cross step S105 and an after-zero-cross step S105 before and after the zero-cross timing tzero arranged in chronological order. In such case, the zero-cross current value Ix acquired at the timing before the zero-cross timing tzero among the two timings corresponds to an immediately-before current value that has already been acquired immediately before the zero-cross of the phase voltages Vu, Vv, and Vw. The function of the control unit 30 to perform the processes of steps S106 and S107 corresponds to a current selection unit. The function of performing the processes of steps S101 to S107 corresponds to a zero-cross current acquirer.

As shown in FIG. 6, when the zero-cross timing tzero is between the detection timings td3 and td4, the detection timing td3 is considered as the corresponding timing tx. The shunt current value Isd3 detected at detection timing td3 is considered as the zero-cross current value Ix. Such shunt current value Isd3 corresponds to an immediately-before current value, also known as a previous value.

By repeating the arithmetic processing by the control unit 30, in steps S101 to S107, each time a zero-cross occurs at any of the phase voltages Vu, Vv, and Vw, the zero-cross current value Ix is acquired and stored in the memory 32. That is, in steps S101 to S107, the zero-cross current value Ix corresponding to each zero-cross of the phase voltages Vu, Vv, and Vw is acquired.

As shown in FIGS. 2 and 5, for example, when the corresponding timings tx1 to tx6 corresponding to the zero-cross of the phase voltages Vu, Vv, and Vw occur, the zero-cross current values Ix1 to Ix6 are detected and stored in the memory 32. The zero-cross current values Ix3 and Ix6 at the corresponding timings tx3 and tx6 are U-phase zero-cross current values Ix corresponding to the zero-cross of the U-phase voltage Vu, and respectively correspond to a first zero-cross current value. The zero-cross current values Ix2 and Ix5 at the corresponding timings tx2 and tx5 are V-phase zero-cross current values Ix corresponding to the zero-cross of the V-phase voltage Vv, and respectively correspond to a second zero-cross current value. The zero-cross current values Ix1 and Ix4 at the corresponding timings tx1 and tx4 are W-phase zero-cross current values Ix corresponding to the zero-cross of the W-phase voltage Vw, and respectively correspond to a third zero-cross current value. Note that the U-phase voltage Vu corresponds to a first phase voltage, the V-phase voltage Vv corresponds to a second phase voltage, and the W-phase voltage Vw corresponds to a third phase voltage.

Returning to FIG. 3, in step S108, an average value Ixa of the zero-cross current values Ix is calculated. Here, the average value Ixa of these zero-cross current values Ix is calculated by using a plurality of zero-cross current values Ix included in one cycle T. In such step S108, the average value Ixa is calculated by using the same number of the U-phase zero-cross current values Ix, the V-phase zero-cross current values Ix, and the W-phase zero-cross current values Ix. For example, as shown in FIG. 2, when the zero-cross current values Ix1 to Ix6 are included in one cycle T, two zero-cross current values Ix for each of the U phase, V phase, and W phase are used, for a total of six, for the calculation of the average value Ixa. The average value Ixa is an effective value before correction for the phase currents Iu, Iv, and Iw.

In one cycle T, zero-crosses of the phase voltages Vu, Vv, and Vw occur as many times as multiples of 3. Therefore, In such step S108, if all the zero-cross current values Ix included in one cycle T are used for the calculation of the average value Ixa, the number of zero-cross current values Ix is a multiple of three. The number of zero-cross current values Ix that is a multiple of 3 includes the same number of U-phase zero-cross current value Ix, V-phase zero-cross current value Ix, and W-phase zero-cross current value Ix. The function of the control unit 30 to perform the process of step S108 corresponds to an average calculation unit and an electric cycle unit.

In step S109, the average value Ixa is corrected using a correction coefficient K, and the effective current value Irms is calculated. The correction coefficient K is stored in the memory 32 as a predetermined coefficient value. A plurality of coefficient values are stored in the memory 32 corresponding to the values of correction parameters such as a motor rotation number and the instruction voltage. In such step S109, among the plurality of coefficient values, the coefficient value corresponding to an actually detected correction parameter is read from the memory 32 as the correction coefficient K. Then, the average value Ixa is multiplied by the correction coefficient K to calculate the effective current value Irms. The effective current value Irms corresponds to a motor current value. The function of the control unit 30 to perform the process of step S109 corresponds to a correction unit. The function of performing the processes of steps S108 and S109 corresponds to a motor current calculator.

The correction coefficient K is stored in the memory 32 in the process of manufacturing the control unit 30 and the motor drive device 6. The manufacturing method of the control unit 30 and the motor drive device 6 includes a step of an operator acquiring a correction coefficient K by simulation or the like. In such step, the operator provides the motor system 1 with a current sensor for detecting the phase currents Iu, Iv, Iw. The current sensor is provided for, for example, the terminals 5u, 5v, 5w of the motor 5. The operator detects the phase currents Iu, Iv, and Iw as detected values by the current sensor by performing a simulation or the like, and calculates the effective current value Irms as a simulated effective value by using the Equation 1 in FIG. 2 with these detected values. The operator detects the correction parameter together with the simulated effective value.

Further, the operator calculates the average value Ixa as an effective value before correction in step S108 of the arithmetic processing for the phase currents Iu, Iv, and Iw by performing a simulation or the like. The operator compares the simulated effective value and the average value Ixa for the same value of the common correction parameter, and calculates the correction coefficient K. The operator calculates, for example, the correction coefficient K by dividing the effective current value Irms by the average value Ixa.

Regarding the square wave drive of the motor 5, finding by an applicant should be noted that the simulated effective value and the average value Ixa have a substantially proportional relationship when the waiting time Ton1 is ½ of the ON-time Ton. In such case, the average value Ixa has linearity with respect to the simulated effective value. According to such finding, regardless of the size of the average value Ixa, the value obtained by multiplying the average value Ixa by the correction coefficient K is approximately the simulated effective value. Therefore, if the waiting coefficient is set to 0.5 in step S102 of the arithmetic processing, the average value Ixa can be corrected by simply multiplying the average value Ixa by the correction coefficient K.

Further, regarding the relationship between the waiting time Ton1 and the ON-time Ton, finding by an applicant should be noted that the simulated effective value and the average value Ixa deviate from the proportional relationship as the waiting time Ton1 becomes a value greater than ½ of the ON-time Ton. In addition, finding by an applicant should be noted that, as the waiting time Ton1 becomes smaller than ½ of the ON-time Ton, the simulated effective value and the average value Ixa deviate from the proportional relationship. Therefore, unlike step S102 of the arithmetic processing, when the waiting coefficient is too large or too small with respect to 0.5, the value of the correction coefficient K may have to be changed according to the size of the average value Ixa. That is, there may be a concern that the calculation for correcting the average value Ixa is complicated. In other words, when the waiting coefficient is too large or too small with respect to 0.5, calculation of the effective current value Irms by correcting the average value Ixa by the correction coefficient K may suffer from deterioration of the calculation accuracy.

In the present embodiment described so far, the shunt current value Isd at the corresponding timing tx corresponding to the zero-cross of the phase voltages Vu, Vv, and Vw is considered as the zero-cross current value Ix. Then, the effective current value Irms of the motor 5 is calculated using such zero-cross current value Ix. Here, regarding the square wave drive of the motor 5, finding by an applicant should be noted that the calculation accuracy of the effective current value Irms becomes high when the corresponding timing tx is included in the ON-time Ton. Along with such finding, according to the present embodiment, the corresponding timing tx is included in the ON-time Ton among the ON-time Ton and the OFF-time Toff in the cycle T of the voltage signal Vref. By appropriately setting the corresponding timing tx in such manner, the calculation accuracy of the effective current value Irms can be improved.

Regarding the square wave drive of the motor 5, finding by an applicant should be noted that the calculation accuracy of the effective current value Irms changes according to a temporal position of the corresponding timing tx in the ON-time Ton. Along with such finding, according to the present embodiment, the corresponding timing tx is set according to the duty ratio D of the voltage signal Vref. In the voltage signal Vref, the length of the ON-time Ton increases or decreases according to the duty ratio D. Therefore, setting the corresponding timing tx according to the duty ratio D means setting the temporal position of the corresponding timing tx in the ON-time Ton. By appropriately setting the corresponding timing tx in the ON-time Ton in such manner, the calculation accuracy of the effective current value Irms can be improved.

Regarding the square wave drive of the motor 5, finding by an applicant should be noted that the calculation accuracy of the effective current value Irms becomes high as the waiting time Ton1 is closer to ½ of the ON-time Ton. In other words, it was found that the closer the waiting time Ton1 is to ½ of the ON-time Ton, the closer the relationship between the simulated effective value and the average value Ixa becomes proportional. Along with such finding, according to the present embodiment, the waiting time Ton1 is set to ½ of the ON-time Ton. Therefore, when the average value Ixa is corrected to calculate the effective current value Irms, the calculation accuracy of the effective current value Irms is unlikely to lower even if the calculation for correcting the average value Ixa is simplified. That is, it is possible to suppress both (i.e., at the same time) an increase in the processing load of the control unit 30 and a decrease in the calculation accuracy of the effective current value Irms.

According to the present embodiment, the shunt current value Isd detected immediately before the zero-cross timing tzero is selected as the zero-cross current value Ix. Therefore, even if noise or the like is generated in the motor system 1 in accordance (i.e., synchronization) with the zero-cross of the phase voltages Vu, Vv, Vw, the shunt current value Isd not including the noise or the like is acquired as the zero-cross current value Ix. Therefore, the acquisition accuracy of the zero-cross current value Ix can be improved.

According to the present embodiment, the effective current value Irms of the motor 5 is calculated using the zero-cross current value Ix. Of the shunt current values Isd detected in each of the ON-time Ton of the voltage signal Vref, the zero-cross current value Ix corresponding to the zero-cross of the phase voltages Vu, Vv, and Vw likely comes close to the effective value of the phase currents Iu, Iv, and Iw, respectively. Therefore, by using the zero-cross current value Ix for the calculation of the effective current value Irms, the calculation accuracy of the effective current value Irms can be improved.

It is conceivable that the characteristics of the U-phase zero-cross current value Ix, the V-phase zero-cross current value Ix, and the W-phase zero-cross current value Ix are different from each other. On the other hand, according to the present embodiment, the average value Ixa is calculated using the zero-cross current value Ix for each of the U phase, the V phase, and the W phase. Therefore, such an average value Ixa likely has a value close to an actual effective value of the phase currents Iu, Iv, Iw as compared with the average value calculated by using a plurality of zero-cross current values Ix for only one of the U phase, V phase, and W phase, for example. By using the zero-cross current value Ix for each of the U phase, the V phase, and the W phase in such manner, the calculation accuracy of the average value Ixa can be improved.

In one cycle T, it is conceivable that the shunt current value Isd varies due to the fact that the zero-cross timing tzero is different from each other for the phase voltages Vu, Vv, and Vw or due to other causes. On the other hand, according to the present embodiment, the average value Ixa is calculated using a plurality of zero-cross current values Ix acquired in one cycle T. Therefore, such an average value Ixa likely becomes closer to an actual effective value of the phase currents Iu, Iv, Iw than, for example, the average value calculated using the zero-cross current value Ix included in only a part of one cycle T. By using a plurality of the zero-cross current values Ix included in one cycle T in such manner, the calculation accuracy of the average value Ixa can be improved.

According to the present embodiment, the correction coefficient K is used to correct the average value Ixa, which is an average of the zero-cross current values Ix. By simplifying the calculation for correcting the zero-cross current value Ix in such manner, the processing load of the control unit 30 is reducible.

Figure 7:
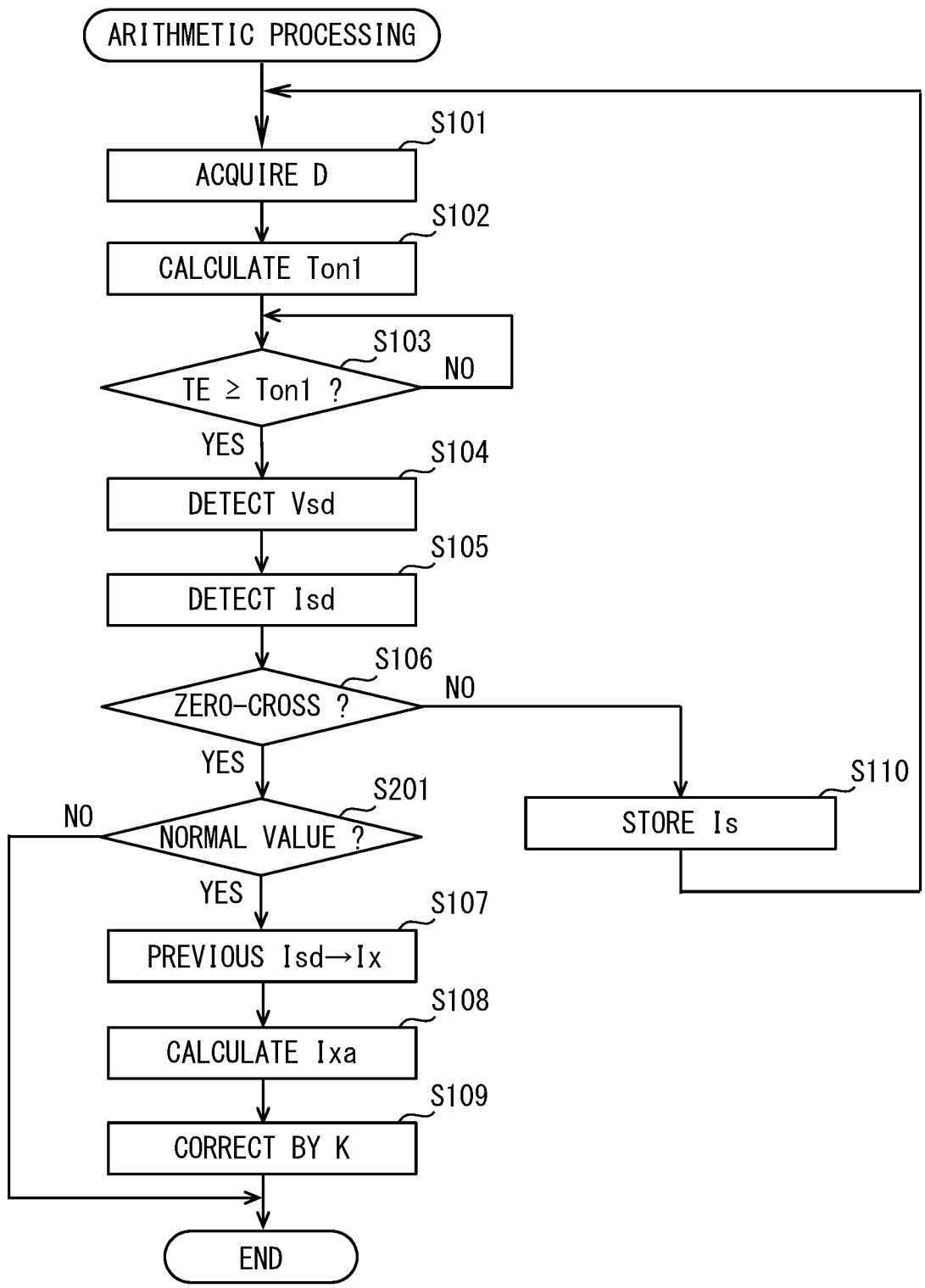
FIG. 7 is a flowchart showing a procedure of arithmetic processing in the second embodiment.

Second Embodiment, FIG. 7

In the first embodiment, the condition for acquiring the shunt current value Isd as the zero-cross current value Ix in the arithmetic processing of the control unit 30 includes a case where the zero-cross of the phase voltages Vu, Vv, and Vw occurs. On the other hand, in the second embodiment, the condition for acquiring the shunt current value Isd as the zero-cross current value Ix includes a case where the shunt current value Isd is a normal value. The configuration, operation, and effect not particularly described in the second embodiment are the same as those in the first embodiment. In the second embodiment, the points different from the first embodiment are mainly described.

The arithmetic processing of the present embodiment is described with reference to the flowchart of FIG. 7. In FIG. 7, in steps S101 to S106, the same processing as in the first embodiment is performed. When a zero-cross of the phase voltages Vu, Vv, Vw occurs in step S106, the process proceeds to step S201.

In step S201, it is determined whether or not the previous shunt current value Isd is a normal value. Here, it is determined whether or not the previous shunt current value Isd is included in a normal range. Regarding the previous shunt current value Isd, if it is included in the normal range, it is determined as a normal value, and if it is not included in the normal range, it is determined not as a normal value. The normal range is variably set according to the past shunt current value Isd and/or the past zero-cross current value Ix stored in the memory 32. For example, the normal range may be set by calculating an increase rate using the shunt current value Isd acquired by the arithmetic processing for a predetermined number of times such as the past 10 times. The normal range may also be set by calculating a pulsation rate or the like by using the zero-cross current value Ix acquired by the arithmetic processing for a predetermined number of times.

If the previous shunt current value Isd is a normal value, the process proceeds to step S107, and the previous shunt current value Isd is acquired as the zero-cross current value Ix. Then, in steps S108 to S110, the same processing as in the first embodiment is performed. If the previous shunt current value Isd is not a normal value, the current calculation process ends. In steps S108 and S109, the average value Ixa is calculated by using a plurality of past zero-cross current values Ix, and the effective current value Irms is calculated by using the average value Ixa. Therefore, even if the previous shunt current value Isd is not a normal value, the number of zero-cross current values Ix used for calculating the average value Ixa is reduced (i.e., by excluding non-normal value(s)), and the effective current value Irms is still calculable.

According to the present embodiment, even if the shunt current value Isd is detected at the corresponding timing tx, if the shunt current value Isd is not a normal value, the shunt current value Isd is not set as the zero-cross current value Ix. Therefore, deterioration of the calculation accuracy of the effective current value Irms, by acquiring an abnormal shunt current value Isd as the zero-cross current value Ix and calculating the value Irms using such an abnormal value, is avoidable. Therefore, the calculation accuracy of the effective current value Irms is improvable.

Note that the normal range may be set as a predetermined value, instead of being variably set according to the past data of the shunt current value Isd and the zero-cross current value Ix. For example, in the manufacturing process of the control unit 30 and the motor drive device 6, a normal range may be set by simulation or the like, and information regarding the normal range may be stored in the memory 32.

Figure 8:
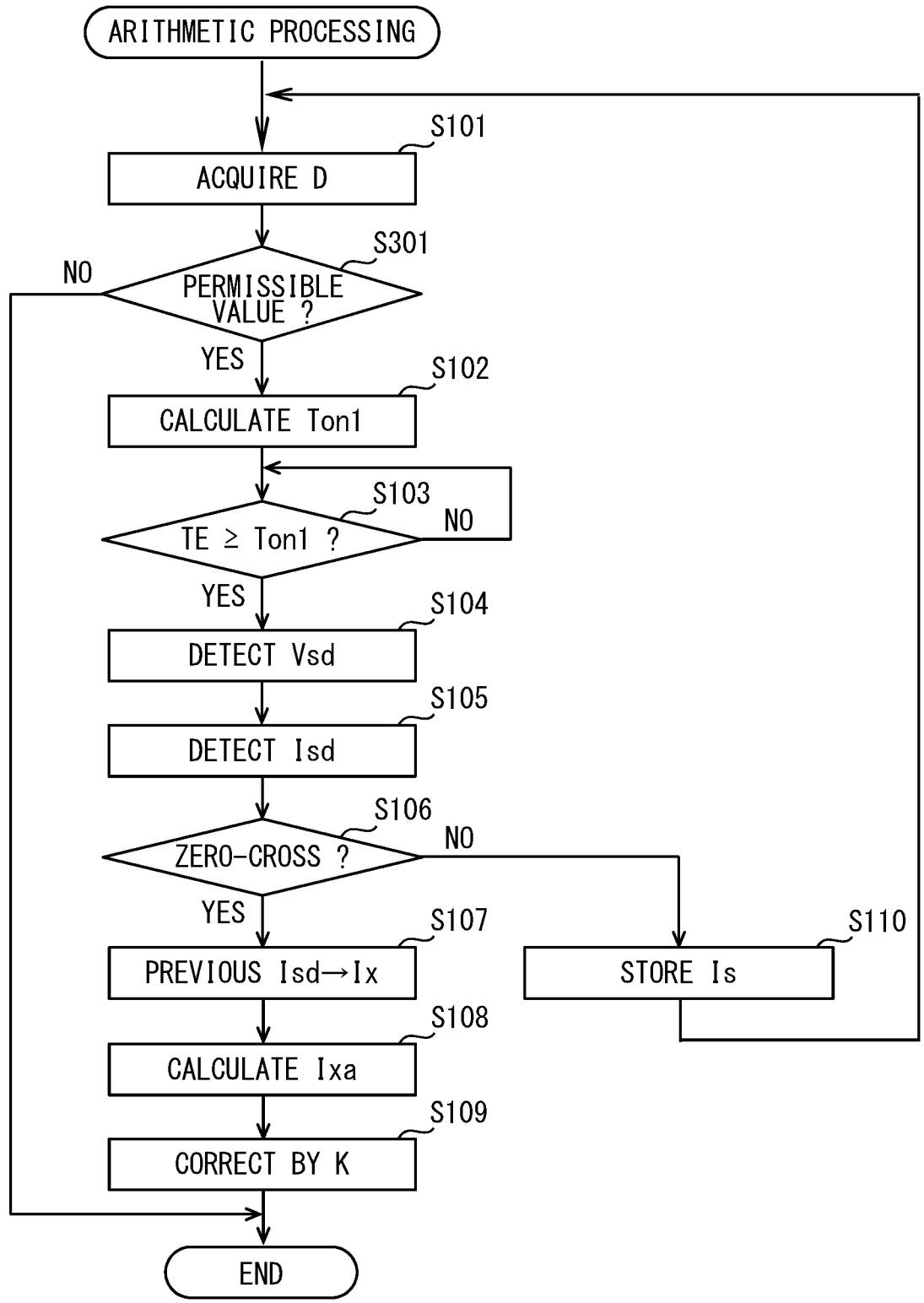
FIG. 8 is a flowchart showing a procedure of arithmetic processing in the third embodiment.

Third Embodiment, FIG. 8

In the third embodiment, the condition for acquiring the shunt current value Isd as the zero-cross current value Ix in the arithmetic processing of the control unit 30 includes a case that the duty ratio D is a permissible value. The configuration, operation, and effect not particularly described in the third embodiment are the same as those in the first embodiment. In the third embodiment, the points different from the first embodiment are mainly described.

The arithmetic processing of the present embodiment is described with reference to the flowchart of FIG. 8. In FIG. 8, in step S101, the same processing as in the first embodiment is performed. After acquiring the duty ratio D in step S101, the process proceeds to step S301.

In step S301, it is determined whether or not the duty ratio D is a permissible value. Here, whether or not the duty ratio D is included in a predetermined permissible range is determined. The permissible range is set by simulation or the like in the manufacturing process of the control unit 30 and the motor drive device 6, and is stored in the memory 32. The operator compares the simulated effective value with the effective current value Irms calculated in step S109 of the first embodiment for each duty ratio D. The operator calculates a deviation of the effective current value Irms from the simulated effective value, and sets the permissible range of the duty ratio D within a scope where the deviation does not become excessively large. Regarding the permissible range of the duty ratio D, finding by an applicant should be noted that the smaller the duty ratio D becomes, the larger the deviation of the effective current value Irms from the simulated effective value becomes. According to such finding, the smaller the duty ratio D becomes, the lower the accuracy of calculating the effective current value Irms becomes. For example, for the duty ratio D, values that are too small are not included in the permissible range.

When the duty ratio D is a permissible value, the same processing as in the first embodiment is performed in steps S102 to S110 to calculate the effective current value Irms. If the duty ratio D is not a permissible value, the current calculation process ends.

According to the present embodiment, when the duty ratio D is not a permissible value, the effective current value Irms is not calculated. Therefore, it is possible to avoid deterioration of the calculation accuracy of the effective current value Irms due to an unacceptable value such as the duty ratio D being too small. If the duty ratio D is not a permissible value, the shunt current value Isd is not detected. Therefore, even if the shunt current value Isd becomes an abnormal value due to the duty ratio D not being a permissible value, the shunt current value Isd is not stored in the memory 32, and the shunt current value Isd is not acquired as the zero-cross current value Ix. Therefore, by not detecting the shunt current value Isd according to the duty ratio D, the acquisition accuracy of the zero-cross current value Ix can be improved.

Note that, in the present embodiment, the condition for acquiring the shunt current value Isd as the zero-cross current value Ix may include the case where the ON-time Ton is a permissible time. For example, in step S301, at least one of (i) determination of whether or not the duty ratio D is a permissible value and (ii) determination of whether or not the ON-time Ton is a permissible time may be performed. For example, it is determined whether or not the ON-time Ton is included in a permissible range. The permissible range for the ON-time Ton is set by, for example, a simulation or the like and stored in the memory 32, similarly to the permissible value for the duty ratio D.

Other Embodiments

The present disclosure is not limited to the embodiments shown as examples. The present disclosure encompasses the illustrated embodiments and variations thereof by those skilled in the art. For example, the present disclosure is not limited to the combinations of components and elements shown in the embodiments, and various modifications and implementations can be performed. The present disclosure may be implemented in various combinations. The present disclosure may have additional portions that may be added to the embodiments. The present disclosure encompasses the omission of components and elements from the embodiments. The present disclosure encompasses the replacement or combination of components and elements between one embodiment and the other. The disclosed technical scope is not limited to the description of the embodiments. It should be understood that the disclosed technical scope is defined in claims and includes all modifications within equivalent of meanings and scope of the claims.

In each of the above embodiments, the control unit 30 may acquire the detection timing td immediately after the zero-cross timing tzero as the corresponding timing tx, and may acquire the shunt current value Isd as the zero-cross current value Ix. For example, in FIG. 6, the control unit 30 may acquire the detection timing td4 as the corresponding timing tx, and may acquire the shunt current value Isd4 as the zero-cross current value Ix. Further, the control unit 30 may acquire the zero-cross current value Ix by setting, as the corresponding timing tx, at least one of the detection timing td immediately before the zero-cross timing tzero and the detection timing td immediately after the zero-cross timing tzero. For example, in FIG. 6, the control unit 30 may acquire an average value of the shunt current value Isd3 at the detection timing td3 and the shunt current value Isd4 at the detection timing td4 as the zero-cross current value Ix. In addition, the control unit 30 may calculate the zero-cross current value Ix using a plurality of shunt current values Isd detected at timings prior to the zero-cross timing tzero. The control unit 30 may also calculate the zero-cross current value Ix by using a plurality of shunt current values Isd detected at timings after the zero-cross timing tzero.

In each of the above embodiments, the control unit 30 may detect the shunt current value Isd only when a zero-cross of the phase voltages Vu, Vv, and Vw occurs. In such case, the control unit 30 acquires the zero-cross current value Ix at the detection timing td immediately after the zero-cross timing tzero as the corresponding timing tx.

In each of the above embodiments, the control unit 30 may calculate the average value Ixa of the motor 5 by using a plurality of zero-cross current values Ix included in one cycle of a mechanical angle instead of the electric angle. Further, the control unit 30 does not have to calculate the average value Ixa. For example, the control unit 30 may calculate the effective current value Irms by correcting one shunt current value Isd with the correction coefficient K.

In each of the above embodiments, the control unit 30 may acquire the corresponding timing tx, the waiting time Ton1, and the like as the electric angle and the mechanical angle instead of acquiring them in chronological order.

In each of the above embodiments, the number of shunt current values Isd used by the control unit 30 to calculate the average value Ixa does not have to be a multiple of 3. For example, the plurality of shunt current values Isd used for calculating the average value Ixa may include a U-phase shunt current value Isd, a V-phase shunt current value Isd, and a W-phase shunt current value Isd in different numbers.

In each of the above embodiments, the control unit 30 may calculate the maximum value or the average value of the phase currents Iu, Iv, and Iw as the motor current value. For example, the control unit 30 may calculate at least one of the effective current value Irms, the maximum value of the phase currents Iu, Iv, and Iw, and the average value of the phase currents Iu, Iv, and Iw.

In each of the above embodiments, the control unit 30 may detect the shunt current value Isd a plurality of times in the cycle T. Further, the control unit 30 may detect the shunt current value Isd in the OFF-time Toff of the cycle T. For example, the control unit 30 may detect the shunt current value Isd in both of the ON-time Ton and the OFF-time Toff in one cycle T. Further, in the third embodiment, when the duty ratio D is not a permissible value or the ON-time Ton is not a permissible time, the control unit 30 may detect the shunt current value Isd in the OFF-time Toff.

In each of the above embodiments, if the control unit 30 drives the motor 5 with a square wave by a pulse signal such as the voltage signal Vref, such pulse signal does not have to be a PWM signal. Further, the voltage signal Vref as a pulse signal does not have to be a square wave signal, and may be, for example, a signal such as a triangular wave, a sawtooth wave, or a trapezoidal wave. Further, the square wave drive of the motor 5 may be an energization drive having an energization angle smaller than 180 degrees. Examples of such square wave drive include a 150-degree energization drive. As described above, the square wave drive is not limited to the method of driving the motor 5 with the square wave, and may be a method of driving the motor 5 by a pulse signal such as a triangular wave, a sawtooth wave, or a trapezoidal wave.

In each of the above embodiments, a current sensor such as a shunt resistor 60 and the like may be provided on the P line 15. For example, the shunt resistor 60 may be provided on at least one of the P line 15 and the N line 16 as long as it is provided on the power supply line. That is, the configuration may be such that the control unit 30 can detect the power supply current value such as the shunt current value Isd.

In each of the above embodiments, the three windings L1, L2, and L3 may be connected by a Y connection instead of a delta connection. The motor system 1 may be provided with a position sensor that detects the mechanical angle of the motor 5.

In each of the above embodiments, the control unit 30 is provided by a control system that includes at least one computer. The control system in such case includes at least one processor (i.e., hardware processor) which is hardware. The hardware processor may be provided as one of the following (i), (ii), or (iii).

(i) The hardware processor may be a hardware logic circuit. In such case, the computer is provided with a digital circuit including a number of programmed logic units (i.e., gate circuits). Digital circuits may include memory that stores at least one of a program and data. The computer may be provided by analog circuit. The computer may be provided as a combination of digital circuit and analog circuit.

(ii) The hardware processor may be at least one processor core that executes a program stored in at least one memory. In such case, the computer is provided as at least one memory and at least one processor core. The processor core is referred to as, for example, a CPU. The memory may also be called as a storage medium. The memory is a non-transitory, substantive storage medium that non-temporarily stores "at least one of a program and data" that can be read by a processor.

(iii) The hardware processor may be a combination of (i) and (ii) described above. (i) and (ii) are placed on different chips or on a common chip.

That is, at least one of the means and functions provided by the control unit 30 can be provided by hardware only, software only, or a combination thereof.

In each of the above embodiments, the vehicle on which the motor drive device 6 is mounted includes a passenger car, a bus, a construction work vehicle, an agricultural machine vehicle, and the like. Further, the vehicle is a type of moving bodies, and the moving body on which the motor drive device 6 is mounted includes a train, an airplane, a ship, and the like in addition to the vehicle. Examples of the motor drive device 6 include an inverter device and a converter device. Examples of such converter device include a power supply device for AC input and DC output, a power supply device for DC input and DC output, and a power supply device for AC input and AC output.

What is claimed is:

1. An arithmetic device performing calculation regarding a three-phase motor that is driven by a pulse signal in a square wave, and is receiving an electric power from a power supply through power supply lines via a power conversion unit that converts the supply of the electric power and that has a plurality of switches being turned ON and OFF according to the pulse signal, the arithmetic device comprising:

a zero-cross current acquirer acquiring a power supply current as a zero-cross current value, the power supply current flowing in the power supply lines at a corresponding timing corresponding to zero-cross of a phase voltage of the motor in an ON period of the pulse signal, the ON period and an OFF period of the pulse signal respectively defining an ON state of a switch having an ON level of the pulse signal and an OFF state of the switch having an OFF level of the pulse signal; and a motor current calculator calculating a motor current value indicative of a motor current flowing in the motor by using the zero-cross current value acquired by the zero-cross current acquirer.

2. The arithmetic device of claim 1, wherein the zero-cross current acquirer has
a timing setting unit for setting the corresponding timing according to a duty ratio of the pulse signal.

3. The arithmetic device of claim 1, wherein a waiting period from a start of the ON period to the corresponding timing is ½ of the ON period.

4. The arithmetic device of claim 1, wherein the zero-cross current acquirer has
a power supply current unit that acquires the power supply current as a power supply current value each time the ON period arrives, and
a current selection unit that selects an immediately-before current value already acquired immediately before the zero-cross by the power supply current unit as the zero-cross current value.

5. The arithmetic device of claim 1, wherein the motor current unit calculates an effective value of the motor current as the motor current value.

6. The arithmetic device of claim 1, wherein:
the zero-cross current acquirer acquires, in view of zero-cross of the phase voltage in three phases, a first zero-cross current value as the zero-cross current value corresponding to the zero-cross of a first phase voltage, a second zero-cross current value as the zero-cross of a second phase voltage, and a third zero-cross current value corresponding to the zero-cross of a third phase voltage, and
the motor current calculator has an average calculation unit for calculating an average value of the first zero-cross current value, the second zero-cross current value, and the third zero-cross current value.

7. The arithmetic device of claim 1, wherein:
the zero-cross current acquirer acquires the zero-cross current value each time the zero-cross of the phase voltage occurs in one of three phases, and
the motor current calculator has an electric cycle unit for calculating an average value of a plurality of the zero-cross current values acquired by the zero-cross current acquirer in one cycle of an electric angle.

8. The arithmetic device of claim 1, wherein the motor current calculator has a correction unit that corrects the zero-cross current value by a correction coefficient.

9. A motor drive device for driving a three-phase motor with a pulse signal in a square wave, the motor drive device comprising:
a power conversion unit that has a plurality of switches being turned ON and OFF according to a pulse signal, and that converts electric power supplied from a power supply to the motor via a power supply line;
a zero-cross current acquirer acquiring a power supply current as a zero-cross current value, the power supply current flowing in the power supply lines at a timing corresponding to zero-cross of a phase voltage of the motor in an ON period of the pulse signal, the ON period and an OFF period of the pulse signal respectively defining an ON state of a switch having an ON level of the pulse signal and an OFF state of the switch having an OFF level of the pulse signal; and
a motor current calculator calculating a motor current value indicative of a motor current flowing in the motor by using the zero-cross current value acquired by the zero-cross current acquirer.

10. An arithmetic device comprising:
a processor, and
a non-transitory computer-readable storage medium,
wherein the arithmetic device is configured to:
acquire a duty ratio;
calculate a waiting period based at least partly on: (i) an on-time, and (ii) a waiting coefficient;
determine that an elapsed time is greater than or equal to the waiting period;
detect a present shunt voltage;
calculate a present shunt current; and
determine whether a zero-cross occurred.

11. The arithmetic device of claim 10, wherein, upon a determination that the zero-cross occurred, the arithmetic device is further configured to:
determine that a previous shunt current is a zero-cross current;
calculate an average zero-cross current based on at least three zero-cross currents respectively from three phases; and
correct the average zero-cross current to generate an effective current.

12. The arithmetic device of claim 11, wherein:
correcting the average zero-cross current is based at least partly upon a motor rotation number and an instruction voltage.

13. The arithmetic device of claim 10, wherein, upon a determination that the zero-cross did not occur, the arithmetic device is further configured to:
determine that the present shunt current is now the previous shunt current;
detect a new present shunt voltage;
calculate a new present shunt current; and
determine whether the zero-cross occurred.

14. The arithmetic device of claim 10, wherein:
the waiting coefficient is approximately 0.5, and is used for calculating waiting period.

* * * * *